United States Patent [19]
Nelson

[11] Patent Number: 5,311,088
[45] Date of Patent: May 10, 1994

[54] TRANSCONDUCTANCE CELL WITH IMPROVED LINEARITY

[75] Inventor: Dale H. Nelson, Shillington, Pa.

[73] Assignee: AT&T Bell Laboratories, Murray Hill, N.J.

[21] Appl. No.: 918,172

[22] Filed: Jul. 23, 1992

[51] Int. Cl.$^5$ .............................................. H03B 5/12
[52] U.S. Cl. ................... 307/520; 307/494; 307/490; 328/167
[58] Field of Search ............... 307/521, 520, 494, 490; 328/167; 333/165

[56] References Cited

U.S. PATENT DOCUMENTS

| | | | |
|---|---|---|---|
| 4,374,335 | 2/1983 | Fukahoki et al. | 307/521 |
| 5,001,441 | 3/1991 | Gen-Kuong | 330/294 |
| 5,051,628 | 9/1991 | Hanna | 307/520 |
| 5,093,634 | 3/1992 | Khoury | 330/253 |
| 5,155,395 | 10/1992 | Motté | 307/521 |
| 5,182,522 | 1/1993 | Tanigawa et al. | 328/167 |
| 5,189,321 | 2/1993 | Seevinck | 302/490 |
| 5,223,743 | 7/1993 | Nakagawara | 307/296 |

OTHER PUBLICATIONS

IEEE Journal of Solid-State Circuits, vol. 26, No. 12, Dec. 1991, 0018-9200/91/1200-1988$01.00, "Design of a 15-MHz CMOS Continuous-Time Filter with On-- Chip Turing", John M., Khoury, Member, IEEE, pp. 1988-1997.

Primary Examiner—William L. Sikes
Assistant Examiner—Dinh Le
Attorney, Agent, or Firm—James H. Fox

[57] ABSTRACT

Analog filters may be conveniently implemented in MOS technology by the use of "transconductance cells". Each cell includes stages each having a pair of current paths, with each path comprising a current source and input transistor. The gain of each stage is set by a transistor connected across the current path, with the transconductance of this transistor being controlled by its gate voltage. In the inventive technique, a transconductance cell comprising two input stages utilizes inputs to each input stage that are in-phase rather than complementary, as in prior-art designs. The inputs to the second input stage are then each balanced (out of phase) with respect to the inputs to the first input stage. Higher linearity is obtained, with the common-mode signal being cancelled by the summation of currents supplied by the input stages to the common output stage. A biquadratic filter conveniently implements this technique, with other applications being possible.

6 Claims, 2 Drawing Sheets

TRANSCONDUCTANCE CELL WITH IMPROVED LINEARITY

BACKGROUND OF THE INVENTION

1. Field of the Invention

The present invention relates to a transconductance cell having improved linearity.

2. Description of the Prior Art

Transconductance cells have been used for various linear circuit applications known in the art. For example, a continuous-time integrating filter has been implemented with this technique; see J. M. Khoury "Design of a 15-MHz CMOS Continuous-Time Filter with On-Chip Tuning", *IEEE Journal of Solid-State Circuits*, vol. 26, no. 12, pp. 1988-1997, December 1991. In particular, FIG. 5 of that article shows one implementation of a transconductance-capacitor integrator. A cell comprising a pair of fully-balanced transconductance input stages is illustrated herein in FIG. 1. In the first input stage (A), the input signals $V_{AP}$ and $V_{AN}$ are applied to the gates of transistors 107 and 109, respectively. The current sources 100 and 101 provide a relatively constant current (I) through transistors 107 and 109, respectively. The transistor 108, connected between the sources of transistors 107 and 109, operates in the resistive (i.e., "triode") region of its characteristic curve. The basic transconductance ($g_m$) of this first input stage is set by the transconductance of transistor 108. In the fully-balanced structure, the resulting currents $I_P$ and $I_N$ supplied to the output stage 106 may be calculated from:

$$I_P - I_N = -g_m \times (V_{AP} - V_{AN}).$$

$I_P$ and $I_N$ consist of two parts from each input pair: From the input pair AP and AN, the current can be considered to be the bias current I with the current through transistor 108 being subtracted from the AP side and added to the AN side. The use of more than one such transconductance transistor is possible, as in the above-noted article.

The currents $I_P$ and $I_N$ are supplied to the output stage 106, comprising current sources 104 and 105, and transistors 113 . . . 116 in the illustrative case. The output stage (106) is biased with voltages BN1 and BN2. The output signals $V_{ON}$ and $V_{OP}$ are produced by the output stage. In operation, it can be seen that a more positive voltage on the gate of transistor 107 (more positive $V_{AP}$) causes $I_P$ to decrease and $I_N$ to increase, so that $V_{OP}$ increases and $V_{ON}$ decreases. A more positive $V_{AN}$ causes $V_{OP}$ to decrease and $V_{ON}$ to increase. A similar effect occurs with changes in $V_{BP}$ and $V_{BN}$ applied to the second input stage (B), comprising current sources 102 and 103 and transistors 110, 111 and 112. In the embodiment shown, the input stages are implemented with p-channel transistors, and the output stage with n-channel transistors. However, other combinations of transistor types are possible, with corresponding changes to the output voltages as a function of the input voltages.

In typical applications, the signals $V_{AP}$ and $V_{AN}$ may be considered the input signals for the circuit of FIG. 1, which typically implements an integrator when coupled to capacitors 23 and 24 in FIG. 2. The signals BP and BN are the feedback signals, which are out-of-phase with respect to the AP and AN signals, respectively, in the filter's pass band. If the transconductances of the two input stages are equal, then $V_{AP}$ and $V_{BN}$ are approximately the same amplitude and phase. Similarly, $V_{AN}$ and $V_{BP}$ are approximately the same amplitude and phase. For example, referring to FIG. 2, a prior-art "biquadratic" low-pass filter is illustrated, wherein each of the filter cells 20 and 21 comprise the circuitry shown in FIG. 1. That is, each cell includes first and second transconductance input stages and an output stage. In addition, capacitors 22, 23, 24 and 25 provide for integration in the illustrative case of a low-pass filter. Note that the input signal $V_{in}$ is supplied to the inputs AP and AN of cell 20. Similarly, the outputs OP and ON of cell 20 are supplied to the AP and AN inputs of cell 21. The BP inputs of both cells 20 and 21 are derived from the ON output of cell 21, which is out of phase with respect to the AP inputs in the passband of the filter. The BN inputs of both cells 20 and 21 are derived from the OP output of cell 21, which is out of phase with respect to the BP inputs in the passband of the filter. Hence, the A inputs in both cells 20 and 21 are approximately balanced, and out of phase with the B inputs.

For low distortion, the circuits of FIGS. 1 and 2 require that the signal input voltage to each cell ($V_{AP} - V_{AN}$) be less than a given value. On the other hand, the signal voltage should be sufficiently high to give adequate signal-to-noise performance. It is desirable in most cases to extend the difference between the minimum and maximum acceptable signal levels; that is, to extend the dynamic range of the circuit. This may be accomplished by extending the linearity of the circuit response so as to cover a wider signal range.

SUMMARY OF THE INVENTION

I have invented a transconductance cell having improved linearity. The inputs to the first input stage of a cell are approximately the same magnitude and phase with respect to each other. The inputs to the second input stage of the cell are also approximately the same magnitude and phase with respect to each other, but out-of-phase with respect to the inputs to the first input stage. A biquadratic filter may be conveniently implemented with the invention.

DETAILED DESCRIPTION

The following detailed description relates to a transconductance cell arrangement having improved linearity. In the present technique, the signal inputs to a first transconductance input stage are arranged to be approximately in phase with one another; the inputs to a second transconductance input stage are arranged to be approximately in phase with one another, but approximately out-of-phase to the signal inputs of the first input stage. The inputs to the second input stage are typically feedback inputs, as in a biquadratic filter arrangement, but other uses of the inventive technique are possible.

Figure 1:
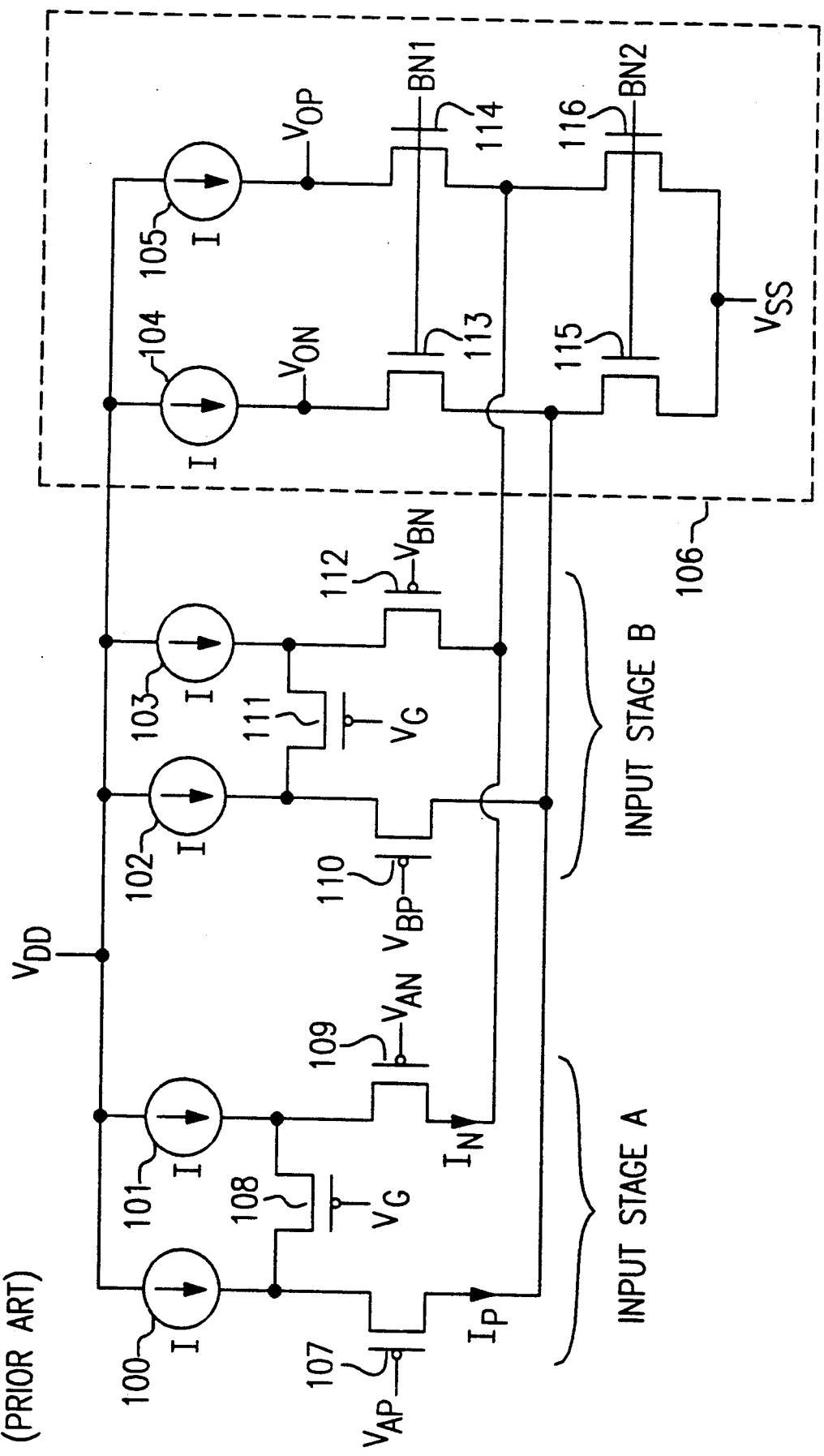
FIG. 1 shows a prior-art filter cell.

In order to implement the inventive technique, the input signals to the circuitry of FIG. 1 are modified as follows: Firstly, the input signals $V_{AP}$ and $V_{AN}$ are approximately in phase. Note that this contrasts to the prior-art technique of providing balanced (i.e., out of phase) signals to these inputs. As used herein, "approximately in phase" means that the signals are within plus or minus 45 degrees of being in phase with each other. Secondly, the signals $V_{BP}$ and $V_{BN}$ to the inputs of the second input stage are approximately in phase. Again, this contrasts to the prior-art technique of providing balanced signals to these inputs. On the other hand, the signal $V_{BP}$ provided to the second input stage is approximately balanced with respect to the signal $V_{AP}$ provided to the first input stage. Similarly, the signal $V_{BN}$ provided to the second input stage is approximately balanced with respect to the signal $V_{AN}$ provided to the first input stage. For example, this approximately balanced condition may be due to the $V_{BP}$ and $V_{BN}$ signals being derived from a filter cell that follows the cell which receives the $V_{AP}$ and $V_{AN}$ signals. In a typical application, the signals are considered to be "approximately balanced" when they are out of phase in the range of from 135 to 225 degrees from one another; that is, within plus or minus 45 degrees of being out of phase by 180 degrees.

Since both inputs of a given input stage are approximately in phase in the inventive technique, the distortion from large differential voltages across the transistors 108 and 111 is reduced because the signal swing is reduced. Also, since the two sides of a given input stage are nearly in phase, the current through transistors 108 and 111 remains small compared to the bias current (I). It would perhaps appear that the in-phase relationship between $V_{AP}$ and $V_{AN}$ could give rise to a common-mode transconductance variation in transistor 108 of the input stage A. However, the opposite common-mode variation occurs in transistor 111 of the input stage B, which cancels this effect to provide the correct transconductance.

Figure 3:
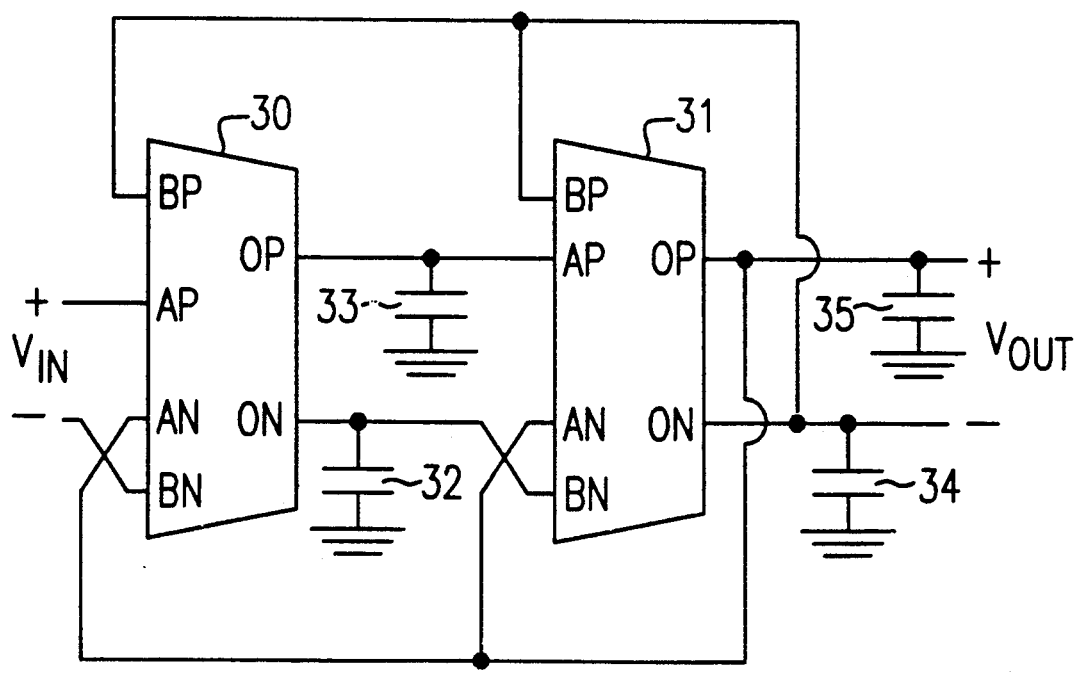
FIG. 3 shows a biquadratic filter using the inventive technique.

The inventive technique is applicable to several types of continuoustime filters where a triode device is used to define the transconductance. FIG. 3 shows one example of a fully-balanced biquadratic filter. Each cell (30, 31) of the filter comprises a pair of transconductance input stages, typically according to the arrangement of FIG. 1, but with inputs provided in accordance to the invention described above. It can be seen that the proper phase relationships as defined above are obtained in this case by the inherent operation of each cell. That is, each cell typically produces a relatively small phase shift between the non-inverting inputs (AP, BP) and output (OP), and a comparably small phase shift between the inverting inputs (AN, BN) and output (ON). Typically, less than 25 degrees phase shift is produced between inputs and outputs of a given cell. In practicing the present invention, the transconductance of the two input stages in the cells of a given biquadratic filter are typically set to be the same. Therefore, the magnitude of the signals at the inputs AP, AN, BP and BN are desirably approximately equal in most cases, which further provides for cancellation of common-mode transconductance variations. For this reason, I recommend that the signal magnitudes at the inputs of a given input stage be within plus or minus 50 percent, and preferably within plus or minus 25 percent, of each other.

Figure 2:
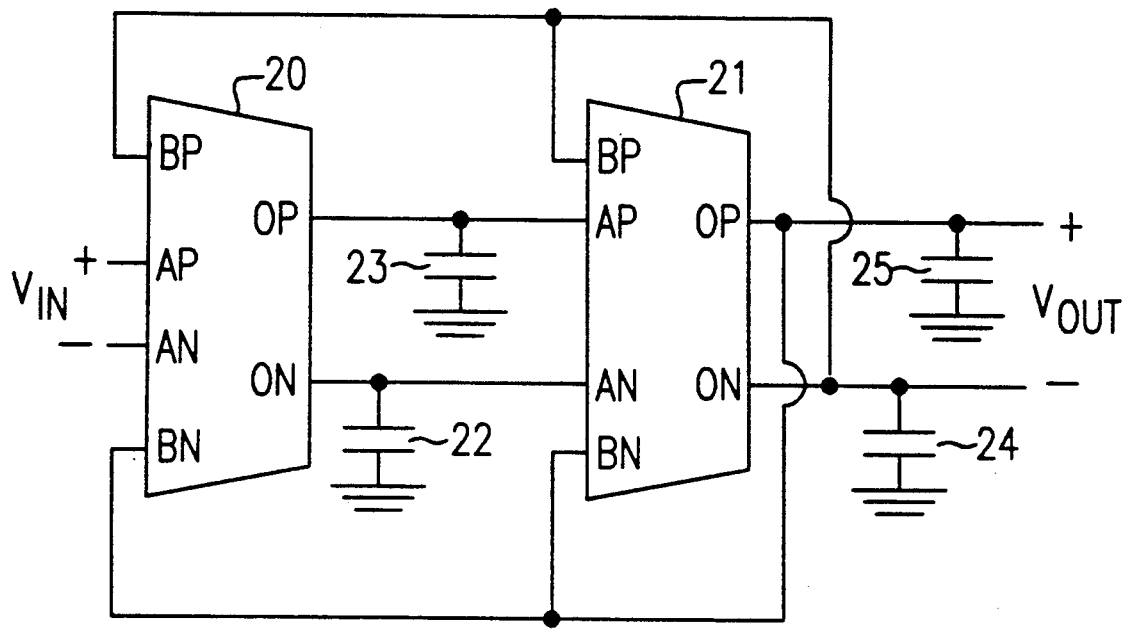
FIG. 2 shows a prior-art biquadratic filter.

Although a biquadratic filter is shown in FIG. 3, the present technique may be used with higher-order filters by using a cascade of biquadratic filters, or alternatively by the "leapfrog" technique known in the art. The present invention may be practiced in some filter cells but not others, as for example, when it is desired to employ some cells having non-equal transconductances. The designation of inputs shown in FIGS. 2 and 3 as non-inverting (AP, BP) or inverting (AN, BN) shows the proper correspondance to the associated outputs (OP, ON), but is otherwise arbitrary. Applications of the present invention to filters other than low-pass filters are apparent, including, for example, bandpass filters. In addition, the present invention may generally be applied to amplifiers and other non-filter designs. At least some (i.e., two or more) of the cells employing the inventive technique are typically implemented on the same integrated circuit, in order to obtain wellmatched characteristics. However, various other cell arrangements implemented with multiple integrated circuits are also possible.

While a single input transistor is shown for each current path in FIG. 1, the use of multiple-transistors is possible, and included herein. For example, in the case of a two-transistor source-follower input circuit, the input transistor is coupled to the output stage through a feedback transistor, according to a technique known in the art. The use of a unity-gain operational amplifier to drive the input transistors is also known, and also included herein. Although the above embodiment has shown the use of field effect devices as the input transistors, the use of bipolar types is alternatively possible. In that case, the transconductance transistor may still be of the field effect type, and the circuit may be implemented on a single integrated circuit chip with BICMOS technology, for example. Still other variations will be apparent to persons skilled in the art.

I claim:

1. A circuit employing first and second input stages and an output stage, each input stage having first and second current paths each comprising a current source connected in series with a signal input transistor coupled to said output stage, and each input stage having a controlled transconductance transistor connected between the first and second current paths, characterized in that said circuit further comprises means for providing first and second signals that are of approximately equal magnitude and approximately in phase to the control electrodes of signal input transistors of the first input stage, and still further comprising means for providing third and fourth signals that are of approximately equal magnitude and approximately in phase to the control electrodes of signal input transistors of the second input stage, wherein said third and fourth signals are approximately balanced with respect to said first and second signals.

2. The circuit of claim 1 wherein said first and second input stages and said output stage comprise a first cell of a filter, and said means for providing second and third signals is a second cell of said filter.

3. An integrated circuit comprising a biquadratic filter comprising a first cell and a second cell, with each cell having first and second non-inverting inputs (AP, BP), first and second inverting inputs (AN, BN), a non-inverting output (OP), and an inverting output (ON);

wherein the second non-inverting inputs (BP) of said first and second cells are connected to the inverting output (ON) of said second cell, and the first non-inverting input (AP) of said second cell is connected to the non-inverting output (OP) of said first cell;

characterized in that the second inverting input (BN) of said second cell is connected to the inverting output (ON) of said first cell, and the first inverting inputs (AN) of said first and second cells are connected to the non-inverting output (OP) of said second cell.

4. The integrated circuit of claim 3 further comprising means for providing to said first cell an approximately balanced input signal to the first non-inverting input (AP) and the second inverting input (BN) of said first cell.

5. An integrated circuit comprising a biquadratic filter comprising a first cell and a second cell, with each cell having a first input stage, a second input stage, and an output stage:

wherein each input stage has first and second current paths each comprising a current source connected in series with a signal input transistor coupled to said output stage, and having a controlled transconductance transistor connected between the first and second current paths; and wherein the output stage provides first and second outputs;

wherein the control electrode of a signal input transistor of the first current path of the first input stage of said second cell is connected to the first output of said first cell;

the control electrode of a signal input transistor of the first current path of the second input stage of said first cell, and the control electrode of a signal input transistor of the first current path of the second input stage of said second cell, are both connected to the second output of said second cell;

characterized in that the control electrode of a signal input transistor of the second current path of the first input stage of said first cell, and the control electrode of a signal input transistor of the second current path of the first input stage of said second cell, are both connected to the first output of said second cell; and the control electrode of a signal input transistor of the second current path of the second input stage of said second cell is connected to the second output of said first cell.

6. The integrated circuit of claim 5 further comprising means for providing to said first cell an approximately balanced input signal to the control electrodes of signal input transistors of the first current path of the first input stage, and the second current path of the second input stage.

* * * * *